(12) United States Patent
Ito

(10) Patent No.: US 7,045,800 B2
(45) Date of Patent: May 16, 2006

(54) ELECTRON BEAM DRAWING APPARATUS

(75) Inventor: Hiroyuki Ito, Hitachinaka (JP)

(73) Assignee: Hitachi-High Technologies Corporation, Tokyo (JP)

( * ) Notice: Subject to any disclaimer, the term of this patent is extended or adjusted under 35 U.S.C. 154(b) by 0 days.

(21) Appl. No.: 10/255,602

(22) Filed: Sep. 27, 2002

(65) Prior Publication Data
US 2003/0116721 A1  Jun. 26, 2003

(30) Foreign Application Priority Data
Dec. 20, 2001 (JP) .............................. 2001-386908

(51) Int. Cl.
*H01J 37/302* (2006.01)
*H01J 37/317* (2006.01)

(52) U.S. Cl. .............................. 250/492.22; 250/492.23

(58) Field of Classification Search ............. 250/492.1, 250/492.2, 492.22, 492.21, 491.1
See application file for complete search history.

(56) References Cited

U.S. PATENT DOCUMENTS

| 5,831,273 | A | * | 11/1998 | Someda et al. | ........ | 250/492.22 |
| 6,171,760 | B1 | * | 1/2001 | Yamazaki et al. | .......... | 430/296 |
| 6,495,841 | B1 | * | 12/2002 | Ando et al. | ............ | 250/492.23 |

FOREIGN PATENT DOCUMENTS

JP          51-13991          5/1976

\* cited by examiner

*Primary Examiner*—Jack I. Berman
(74) *Attorney, Agent, or Firm*—Dickstein Shapiro Morin & Oshinsky LLP

(57) ABSTRACT

To provide an electron beam drawing apparatus capable of drawing the grating pitch of a fine diffraction grating pattern highly precisely.

An objective lens is constructed of lenses of two stages, and an object deflector is disposed over the objective lens of the lower stage. The power of the objective lens of the lower stage is changed to change the deflection width of the object deflector, and the power of the objective lens of the upper stage is changed to form the image on a sample plane thereby to make a focusing.

8 Claims, 4 Drawing Sheets

ELECTRON BEAM DRAWING APPARATUS

BACKGROUND OF THE INVENTION

1. Field of the Invention

The present invention relates to an electron beam drawing apparatus for exposing a sample to a desired pattern or the like by irradiating the sample with an electron beam.

2. Related Art

In the field of optical communications, a highly precise diffraction grating is used for wavelength separations of a semiconductor laser or the like. Especially for multiple wavelengths in an optical communication fiber cable, in order to increase the transfer capacity, and investigations have been made against that increase. It is, therefore, an important subject to make the pitch size of the diffraction grating highly precisely. Specifically, it is necessary to draw the grating pitch of quarter microns in the precision of sub-nanometers.

The electron beam drawing apparatus has a higher resolution than that of an optical exposure apparatus or the like and can form a fine drawing pattern so that it is deemed suitable for the exposure of the fine diffraction grating. The demanded precision for the grating pitch is lower than the resolution of the size for the electron beam drawing apparatus to draw with an electron beam, thereby to make it very difficult to draw the grating pitch accurately. This difficulty is serious when a plurality of grating pitches have to be changed in the course of the drawing operation.

In the electron beam drawing apparatus, the drawing data are converted, after corrected in the deflection distortion, into an analog output by a DA converter thereby to deflect the beam. The problem is the resolution of the DA converter, i.e., the LSB (Least Significant Bit) value. The LSB value has to be a resolution higher than the sub-nanometer corresponding to the difference of the pitch which should be extremely finely variable. With the fine LSB value, the deflection range is restricted by the restriction on the bit number of the DA converter thereby to cause problems in the connections and the elongation of the drawing time. In the circuit, the pitch can be changed by adjusting the gain of the amplifier of the analog output circuit finely. However, it is necessary to complicate the circuit and to make the adjustment in a high grade.

SUMMARY OF THE INVENTION

An object of the present invention is to solve the aforementioned problems and to provide an electron beam drawing apparatus capable of drawing the grating pitch of a fine diffraction grating pattern highly precisely.

In order to achieve the above-specified object, according to the present invention, an objective lens is constructed of lenses of two stages, and an object deflector is disposed over the objective lens of the lower stage. The power of the objective lens of the lower stage is changed to change the deflection width of the object deflector, and the power of the objective lens of the upper stage is changed to form the image on a sample plane thereby to make a focusing. By determining the positional relations of the individual lenses, as will be described hereinafter, moreover, the influence on the failure in the focusing can be reduced even if the power of the lens of the lower stage is changed. On the other hand, the focusing sensitivity of the upper stage lens can be made far higher than that of the lower stage lens. In this manner, the focusing can be made with the upper stage lens, and the deflection sensitivity and the rotation of the electron beam can be controlled with the lower stage lens. Thus, the grating pitch of the fine diffraction grating pattern can be drawn highly precisely.

DESCRIPTION OF THE PREFERRED EMBODIMENTS

The electron beam drawing apparatus is divided into a batch exposure type, in which an electron beam is passed through a shaping aperture to form a shaped beam so that a sample is exposed to the beam shape, and a spot beam type in which patterns are sequentially drawn with an electron beam. The invention will be described in connection with its embodiment by using an example of the batch exposure type, but need not be changed in construction for similar actions and effects even in the spot beam type so that it can be applied to the two types.

Figure 1:
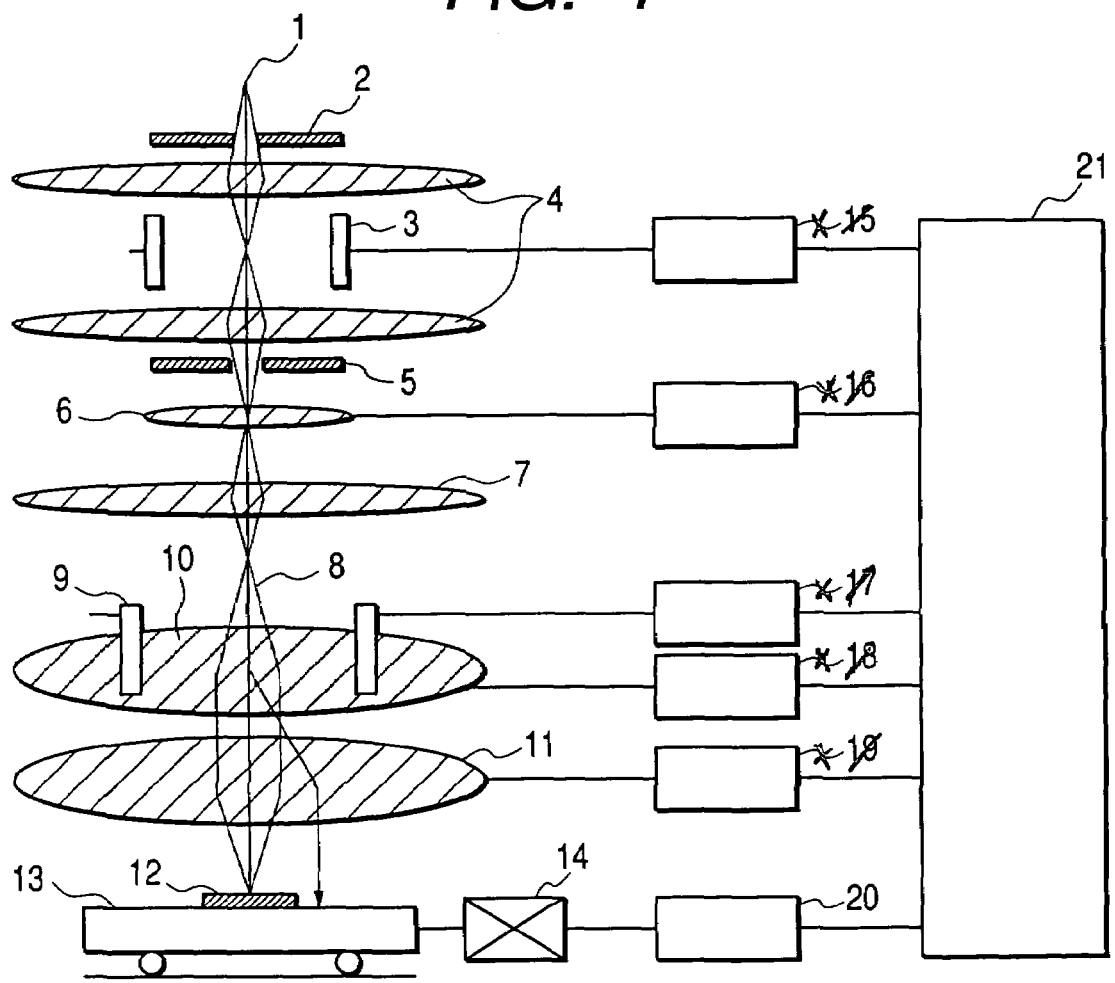
FIG. 1 is a longitudinal section showing a fundamental construction of an electron beam drawing apparatus.

One embodiment of the invention will be described with reference to the accompanying drawings. FIG. 1 is a longitudinal section showing a fundamental construction of the electron beam drawing apparatus.

An electron beam emitted from an electron source 1 irradiates a first shaping aperture 2, which is focused on a second shaping aperture 5 by a shaping lens 4. The image of the first shaping aperture 2 on the second shaping aperture is deflected by a shaping deflector 3 so that the sectional shape of a variable shaped beam 8 is determined by controlling the irradiation position. The electron beam having passed the second shaping aperture 5 is the shaped beam 8 and is projected at a reduction of one several tenth on a drawing sample 12 by a reducing lens 7, a first objective lens 10 and a second objective lens 11. The position of projection on the drawing sample 12 is designated by positioning an object deflector 9 and a sample stage 13 with a sample stage drive system 14 and a stage control circuit 20. Below the second shaping aperture 5, moreover, there is arranged a rotary lens 6 which has such a long focal point as to exert no influence on the focusing of the shaped beam 8, thereby to control the rotation of the shaped beam 8. From FIG. 1, here are omitted an electron gun control mechanism for beam extractions and a blanking control mechanism for turning ON/OFF the beam.

These mechanisms are corrected and controlled on real time by a control computer 21. This control computer 21 includes a digital circuit for processing the drawing data. Moreover, the control computer 21 has a deflection distortion correcting function to measure and correct the mechanical error of the object deflector 9, the control circuit gain and the electron-optic distortion.

Figure 2:
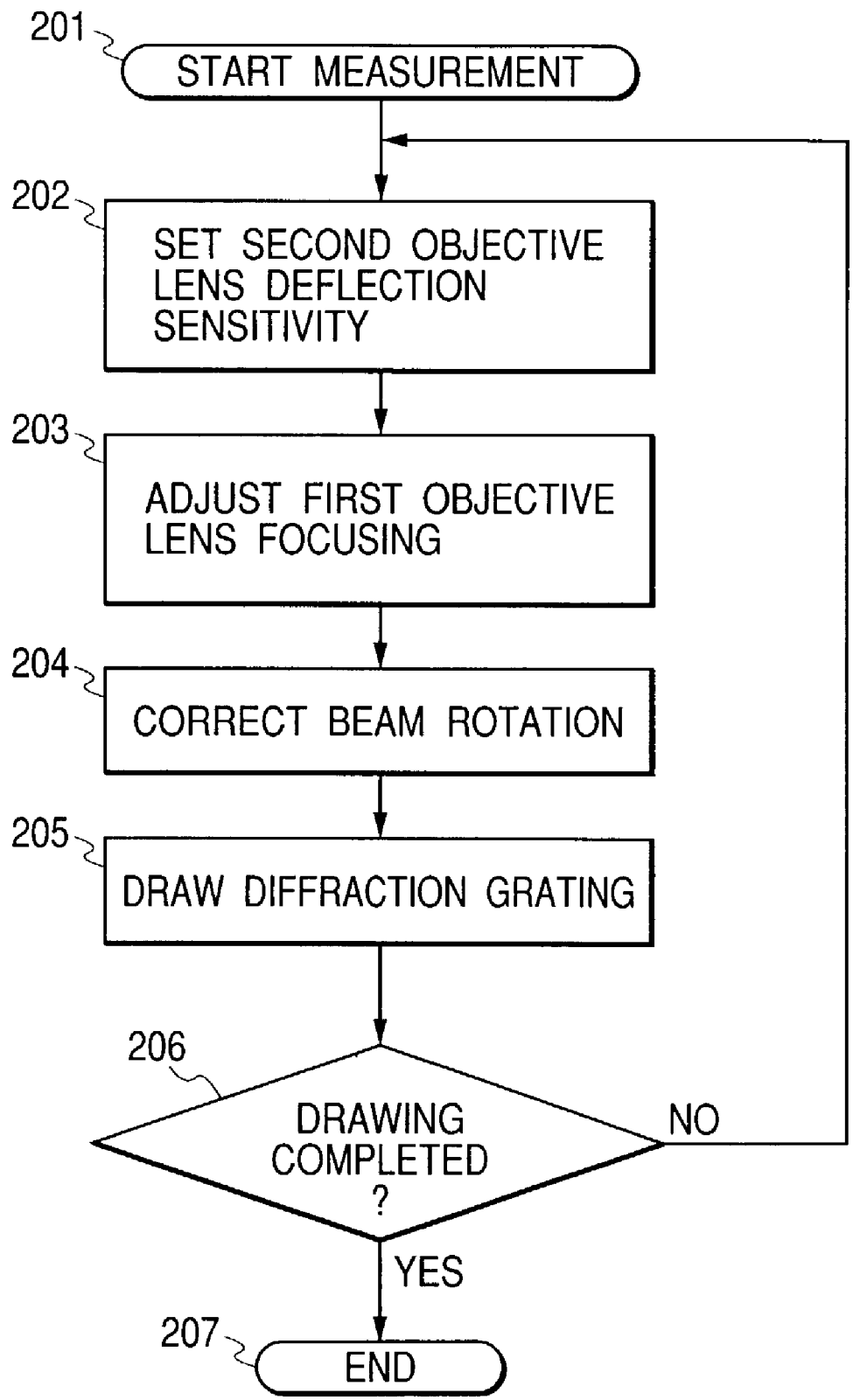
FIG. 2 is a flow chart showing a procedure of controls according to the present invention.

FIG. 2 is a flow chart schematically showing such a procedure of controls according to the invention as is performed from the measurement start of Step 201 to Step 207. The deflection sensitivity of the second objective lens 11 is set at Step 202; the focusing of the first objective lens 10 is adjusted at Step 203; the beam rotation is corrected at Step 204; the diffraction grating is drawn at Step 205; and it is decided by deciding the drawing end of Step 206 whether or not the routine is ended or returned to Step 202.

Figure 3:
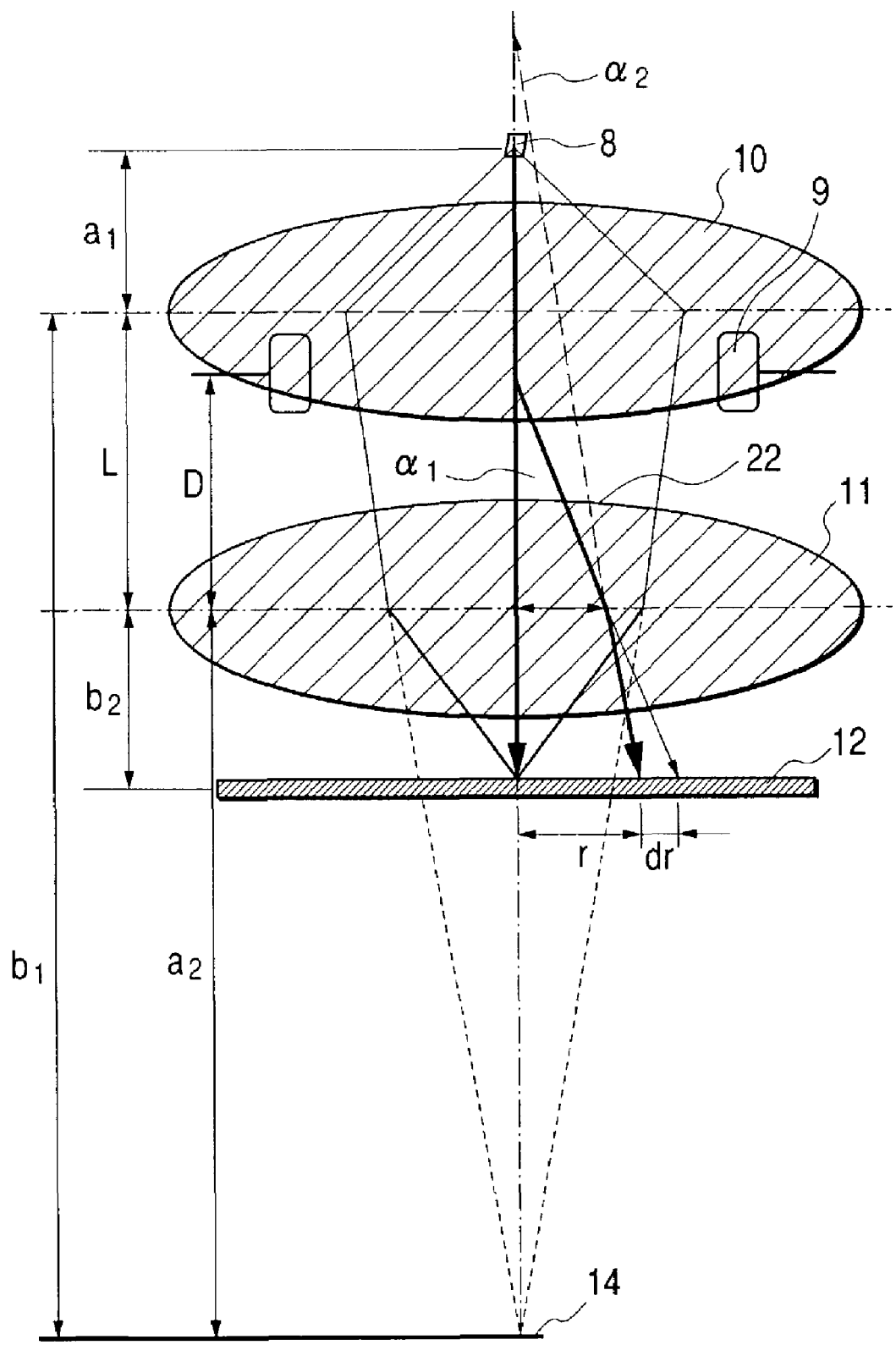
FIG. 3 is a schematic diagram showing the optical relations of objective lenses.

The construction of the objective lenses will be described with reference to FIG. 3. FIG. 3 is a schematic diagram showing the optical relations of the objective lenses. The first objective lens 10 and the second objective lens 11 are arranged in the recited order from the object point so that the image is focused on a sample plane located at a position of $b_2$ from the center of the second objective lens 11. In the invention, the deflected shape is controlled by the second objective lens 11. It is desired that the focal distance is unchanged even with the control. The conditions for the desire will be determined.

In FIG. 3, the distance from the object point to the first objective lens 10 is designated by $a_1$, and the distance between the individual lens centers is designated by L. These lengths are fixed. The first objective lens 10 has a focal distance $b_1$, and the second objective lens 11 has an object point distance $a_2$.

The lens formula of $1/f_1=1/a_1+1/b_1$ is reformed into $b_1=a_1f_1/(a_1-f_1)$. For a condition of $a_1 \sim f_1$, $b_1 >> L$, and $a_2=b_1-L \cong b_1$. Hence, $b_2=a_2f_2/(a_2-f_2)=a_1f_1f_2/\{a_1f_1-f_2(a_1-f_1)\}=a_1f_1f_2/\{f_1(a_1-f_2)-a_1f_2\}$.

If the lens arrangement is set to $a_1 \cong f_2$, the imaging point depends so simply on the focal distance of the first object lens 10 as is expressed by $b_2 \cong a_1f_1f_2/(-a_1f_2)=-f_1$.

The minus symbol is taken because the object point of the second objective lens 11 is located on the same side as the focal point. If the lens arrangement is set to $a_1 \cong f_1$, on the contrary, the imaging point depends on the focal distance of the second objective lens 11.

In the present embodiment, the object is satisfied by the former condition, under which the deflection shape is controlled by the second objective lens 11 so that it exerts no influence on the imaging distance.

If the lens imaging relations are so set as described above, it is possible to reduce the focusing sensitivity of the second objective lens 11 to a remarkably low level. Moreover, the objective lens deflection sensitivity can be estimated in the following manner.

In FIG. 3, the distance from the center of the second objective lens 11 to the center of the object deflector 9 is designated by D. Moreover, the object deflector 9 has a deflection angle $\alpha_1$. If it is assumed that the first objective lens 10 has a small influence on the deflection sensitivity and that the apparent deflection angle under the converging action of the second objective lens 11 is designated by $\alpha_2$ from FIG. 2, magnification relations result in $M=\alpha_1/\alpha_2=Df_2/(D-f_2)$ and $\alpha_2=\alpha_1(1-D/f_2)$, and the deflection angle, i.e., the deflection magnification is variable for the focal distance $f_2$ of the second objective lens 11.

Figure 4:
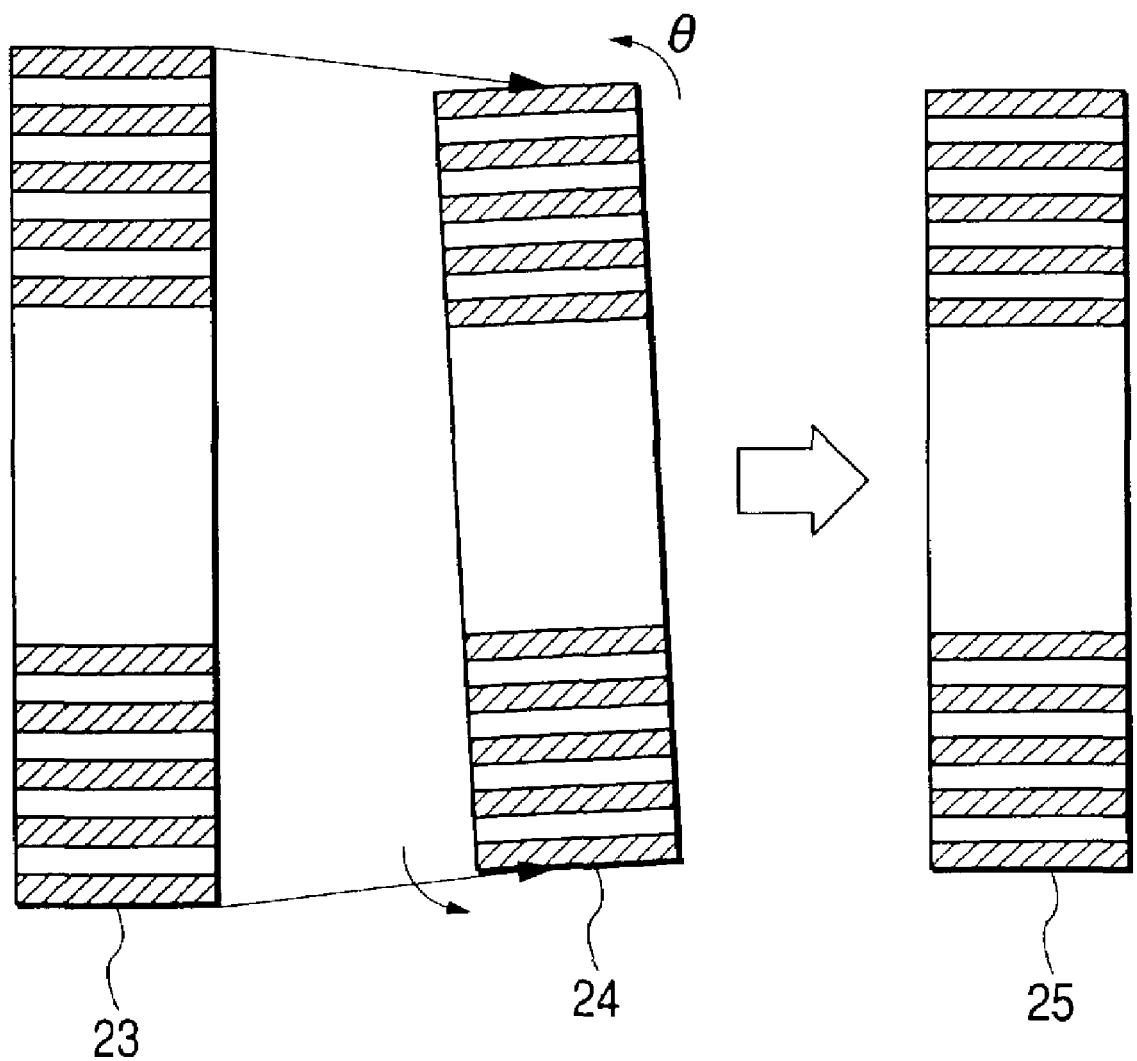
FIG. 4 is a top plan view showing examples of drawn patterns on a sample.

FIG. 4 is a top plan view showing examples of the drawn patterns on the sample. A standard pattern 23 sets a diffraction grating pattern having a pattern similar to that to be drawn. This diffraction grating pattern is basically described in the apparatus control unit LSB values. This deflection magnification corrected pattern 24 is obtained from a standard pattern 23 by executing the reducing corrections with the second objective lens 11. A rotation corrected pattern 25 is obtained from the deflection magnification corrected pattern 24 by correcting the rotation of the shaped beam 8 with the rotary lens and the object deflection rotation with the deflection distortion correcting function.

In a drawing apparatus or an observing apparatus using an electron beam, a magnetic field type lens is generally used. If the exciting electric current is controlled by a high-resolution DAC, however, the deflection magnification can be set reproducibly and highly precisely. If a 20-bit DAC is used at the time of setting the electric current of the second objective lens 11, for example, there is obtained a set resolution of a ppm order. The ordinary diffraction grating pattern width is 1 mm or less within the object deflection range. It is, therefore, unnecessary to draw by making the connections while transferring the stage. Moreover, the variable width of the diffraction grating pitch is 1% or less, and its adjustment is linearly proportional to the lens power, so that a sufficient approximation can be obtained by interpolating the adjusted value in that value. For a higher precision, however, there may be used the well-known polynomial approximation. Here has been described the embodiment in the electron beam drawing apparatus of variable rectangular type. However, the present invention can be easily applied to another type such as an electron beam drawing apparatus using a spot beam, without changing its construction.

According to the present embodiment, the deflection magnification can be set highly precisely, as has been described hereinbefore. Especially, the coordinate designations can be electron-optically made more finely than the apparatus control unit so that the drawing pitch of the fine diffraction grating can be set highly reproducibly. The actions are made in combination of the lens output setting function and the deflection distortion correcting function so that the electron beam drawing apparatus can be realized at a lower cost without any high-grade control circuit.

According to the present invention, it is possible to provide an electron beam drawing apparatus capable of drawing the grating pitch of a fine diffraction grating pattern highly precisely.

What is claimed is:

1. An electron beam drawing apparatus comprising: an electron source for generating an electron beam; a reducing lens group for reducing said electron beam; an objective lens group for converging the reduced shaped beam on a sample plane; an object deflector for deflecting said shaped beam at a desired position on said sample plane; and a stage control circuit for moving and positioning the sample stage within the deflection range of said object deflector by detecting the position of the sample stage mounting said sample, wherein said objective lens group includes lenses of two stages, said electron beam drawing apparatus being constructed such that first the power of the objective lens of the lower stage is changed to change the deflection range of said object deflector and so that second the power of the objective lens of the upper stage is then changed to form the image on said sample plane, thereby to make a focusing, and a focal length of the objective lens of the lower stage is greater than a focal length of the objective lens of the upper stage.

2. An electron beam drawing apparatus according to claim 1, further comprising:

a first transfer mask for shaping said electron beam; a shaping lens group for irradiating a second transfer mask having a plurality of transfer apertures, with said first transfer mask; and a shaping deflector for deflecting the projected image on said first transfer mask, to shape the section of the electron beam to transmit through the transfer apertures of said second transfer mask, to a desired shape.

3. An electron beam drawing apparatus according to claim 1, wherein said object deflector is constructed of a magnetic field lens so that the rotation of said shaped beam due to the change in the power of said magnetic field lens is corrected by a deflection control circuit.

4. An electron beam drawing apparatus according to claim 1, wherein a deflection angle of the electron beam is variable for the focal distance of the objective lens of the lower stage.

5. A method of operating an electron beam drawing apparatus comprising the acts of:
   providing an electron beam drawing apparatus comprising: an electron source for generating an electron beam; a reducing lens group for reducing said electron beam; an objective lens group, including an upper and lower stage lens, for converging the reduced shaped beam on a sample plane; an object deflector for deflecting said shaped beam at a desired position on said sample plane; and a stage control circuit for moving and positioning the sample stage within the deflection range of said object deflector by detecting the position of the sample stage mounting said sample;
   changing the power of the objective lens of the lower stage to change the deflection range of said object deflector; and
   subsequently, changing the power applied to the objective lens of the upper stage to form a focused image on said sample plane.

6. The method of claim 5, further comprising the acts of:
   utilizing a first transfer mask to shape said electron beam;
   irradiating a second transfer mask having a plurality of transfer apertures; and
   deflecting the projected image on said first transfer mask with a shaping deflector so as to shape a section of the electron beam to transmit the section through the transfer apertures of said second transfer mask as a desired shape.

7. The method of claim 5, wherein the object deflector is constructed of a magnetic field lens, the method further comprising the act of correcting a rotation of said shaped beam when power to said magnetic field lens is changed.

8. The method of claim 5, further comprising the act of varying a deflection angle of the electron beam.

* * * * *